United States Patent [19]

Casati et al.

[11] Patent Number: 5,521,439
[45] Date of Patent: May 28, 1996

[54] COMBINATION AND METHOD FOR COUPLING A HEAT SINK TO A SEMICONDUCTOR DEVICE

[75] Inventors: Paolo Casati; Giuseppe Marchisi, both of Milan, Italy

[73] Assignee: SGS-Microelectronics S.r.l., Milan, Italy

[21] Appl. No.: 222,282

[22] Filed: Apr. 5, 1994

[30] Foreign Application Priority Data

Apr. 5, 1993 [EP] European Pat. Off. ............. 93830145

[51] Int. Cl.⁶ .................................................. H01L 23/34
[52] U.S. Cl. ...................... 257/718; 257/719; 361/710; 361/719
[58] Field of Search .................................. 257/718, 719; 361/710, 717, 718, 719

[56] References Cited

U.S. PATENT DOCUMENTS

| | | | |
|---|---|---|---|
| 4,169,642 | 10/1979 | Mouissie | 339/17 F |
| 4,745,456 | 5/1988 | Clemens | 257/718 |
| 4,878,108 | 10/1989 | Phelps, Jr. et al. | 257/718 |
| 4,933,746 | 6/1990 | King | 257/718 |
| 4,978,638 | 12/1990 | Buller et al. | 437/209 |
| 5,276,585 | 1/1994 | Smithers | 257/719 |

FOREIGN PATENT DOCUMENTS

| | | | |
|---|---|---|---|
| 0295387 | 12/1988 | European Pat. Off. | H01L 23/40 |
| 0484180 | 5/1992 | European Pat. Off. | H01L 23/31 |
| 3423725 | 1/1986 | Germany | 257/718 |
| 3434792 | 4/1986 | Germany | 257/718 |
| 0298053 | 12/1990 | Japan | 257/718 |
| 0094456 | 4/1991 | Japan | 257/718 |
| 2195051 | 3/1988 | United Kingdom | H01L 23/40 |

OTHER PUBLICATIONS

Low Profile Heat Sink, IBM Technical Disclosure Bulletin, vol. 28 No. 12 May 1986 pp. 5172–5173.
"Cooling Enhancement of Intel 386/486 By Clip–On Heat Sink," *IBM Technical Disclosure Bulletin*, 33(2):218–219, 1990.

*Primary Examiner*—Rolf Hille
*Assistant Examiner*—David Ostrowski
*Attorney, Agent, or Firm*—David V. Carlson; Robert Iannucci; Seed and Berry

[57] ABSTRACT

A combination of an electronic semiconductor device comprising a metal plate and a plastics body which encapsulates the metal plate leaving at least a major surface thereof exposed, a heat sink, and means of fastening the heat sink to the device. To enable securement of the heat sink on the device without any external fastening arrangement having to be used, and without unduly straining the solder spot of the device pins to a printed circuit, the device is provided with undercut regions on opposite sides adjacent to the exposed surface of the plate for releasable engagement by the fastening means.

17 Claims, 3 Drawing Sheets

COMBINATION AND METHOD FOR COUPLING A HEAT SINK TO A SEMICONDUCTOR DEVICE

FIELD OF THE INVENTION

This invention relates to mounting structures for electronic circuits, and in particular, to a combination of an electronic semiconductor device having a plastics body which includes a metal plate with a major portion of its surface left exposed, and a heat sink attached to the electronic device so as to be in contact with the exposed surface portion of the plate.

BACKGROUND OF THE INVENTION

An electronic semiconductor device of the kind outlined above is a composite structure typically adapted to accommodate an integrated circuit thereon. As is known, an integrated circuit is implemented on a die (chip) of a semiconductor material having a surface area of a few square millimeters, and requires, for its connection to an external circuit such as a printed circuit on a board made of an insulating material, a special holding structure which also enables the circuit to be interconnected electrically. A known structure that fills this demand is basically comprised of a plastics body enclosing the chip, the chip being connected, as by thin wire leads soldered to purposely provided metallized areas of its surface, to corresponding terminal conductors led out of the plastics body. In the instance of power integrated circuits, that is, devices designed to operate on comparatively large currents and accordingly liable to become heated to a considerable extent, such structures further include a metal plate whereby the chip secured thereon can transfer the heat developed during its operation to the outside.

The manufacture of the last-named structures provides for the plate to be formed from sheet metal, e.g., a copper sheet, by a blanking process. The chip is then attached to the metal plate either by a soldering process using a low melting point solder, such as a lead-tin solder, or by gluing using a suitable adhesive, such as an epoxy-based adhesive. Thereafter, a set of metal strips intended to form the device pins or terminal conductors, and which have been blanked off sheet metal but are still held together by interconnecting bridge portions, are mounted on the plate in an electrically isolated fashion therefrom. Thin wires, usually golden wires, are then soldered with one end to the metallized areas of the chip using a low melting point solder, and with the other end, to the ends of the metal strips by a process wherein heat and ultrasound are applied simultaneously. Subsequently, the whole is placed in a suitable mold, into which a plastics material, such as a thermosetting epoxy resin, in a liquefied state is poured. A resin curing step yields then a solid plastics body encapsulating the above-described elements but for one face of the metal plate and part of the metal strips, i.e., the device pins, and the interconnecting bridges therebetween. The latter are then removed as by blanking to yield the finished electronic device.

In the instance of devices intended for surface mounting, that is, for attachment to a printed circuit board by soldering their pin ends to specially arranged metallic areas on the board surface, the pins are bent such that their end portions will all lie in the same plane as one face of the device. This face may alternatively be the exposed surface of the metal plate or the surface of the plastics body opposite to it.

The bend direction of the pins, and hence the face of the device which is to contact the printed circuit board, is selected to suit the device's own heat dissipation requirements in a specific circuit application.

Where the amount of heat to be so dissipated is relatively small, or where a broad metal surface is available on the board for heat dissipation purposes, the pins are bent to cause the exposed surface of the plate to contact the board, specifically a metallic area to which the plate is soldered simultaneously with the pin soldering operation.

With a larger amount of heat to be dissipated, or where it is undesirable or impossible to use a broad surface of the board for heat dissipation, the pins are bent in the opposite direction and a large-size heat sink is attached to the exposed surface of the plate, which is positioned in a plane remote of the plane at which the electronic device contacts the board.

The last-described situation is illustrated by FIG. 1 of the drawings that accompany this specification. For securing the heat sink, indicated there at 10, it is common practice to use a clip 11 affixed to the board 12 and effective to push, with a middle portion 11b thereof, the heat sink 10 centrally against the board, and therefore, against the metal plate 13a of the intervening electronic device, designated 13. In the example shown, the clip 11 is a shaped strip of spring steel having enlarged ends 11a arranged to fit in respective openings 12a of appropriate shape formed in the board 12.

This mounting arrangement has, however, some drawbacks. In particular, it requires that two areas of the board be made available for applying the clip, which detracts from the compactness of the printed circuit as a whole and possibly from the quality of the electric contact between the device pins, designated 13b, and the printed circuit, shown at 12b, because the pressure exerted on the heat sink 10 by the clip 11 will be transferred to the solder spots, not shown, of the pins 13b in the purposely provided areas 12c of the printed circuit.

SUMMARY OF THE INVENTION

It is the object of this invention to provide a combination of an electronic semiconductor device, a heat sink and attachment means, which generally enables the heat sink to be attached to the electronic device without any assistance from external fasteners and without unduly straining the pin-to-printed circuit solder spots.

This object is achieved by a combination of an electronic semiconductor device comprising a metal plate and a plastics body encapsulating the metal plate to leave at least a major surface thereof substantially exposed, a heat sink, and fastening means effective to hold a surface of the heat sink in heat-conduction contact with the exposed surface of the metal plate, wherein the device has undercut regions on opposite sides adjacent to said exposed surface and the fastening means releasably engage the undercut regions.

BRIEF DESCRIPTION OF THE DRAWINGS

The invention can be more clearly understood by making reference to the following detailed description of an exemplary, and hence in no way limitative, embodiment thereof, to be read in conjunction with the accompanying drawings, in which.

DETAILED DESCRIPTION OF THE INVENTION

Figure 2:
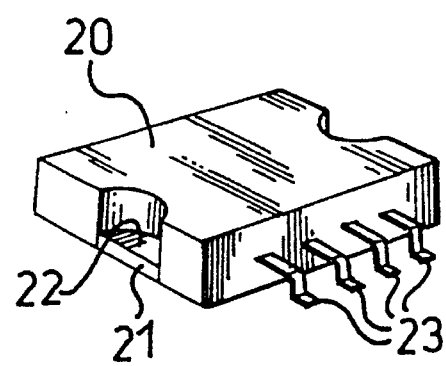
FIG. 2 is an enlarged perspective view of a conventional electronic device.
Figure 2A:
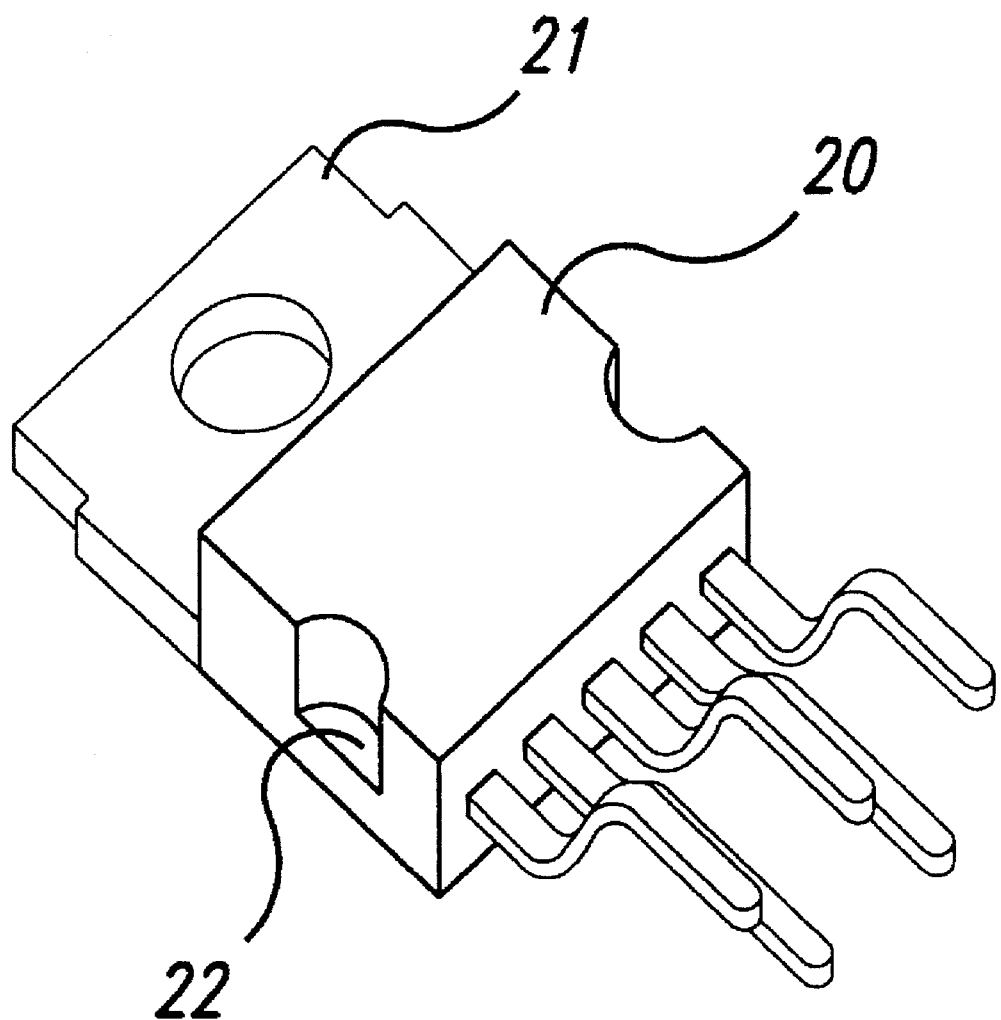
FIG. 2A is an enlarged perspective view of another conventional electronic device.
Figure 3:
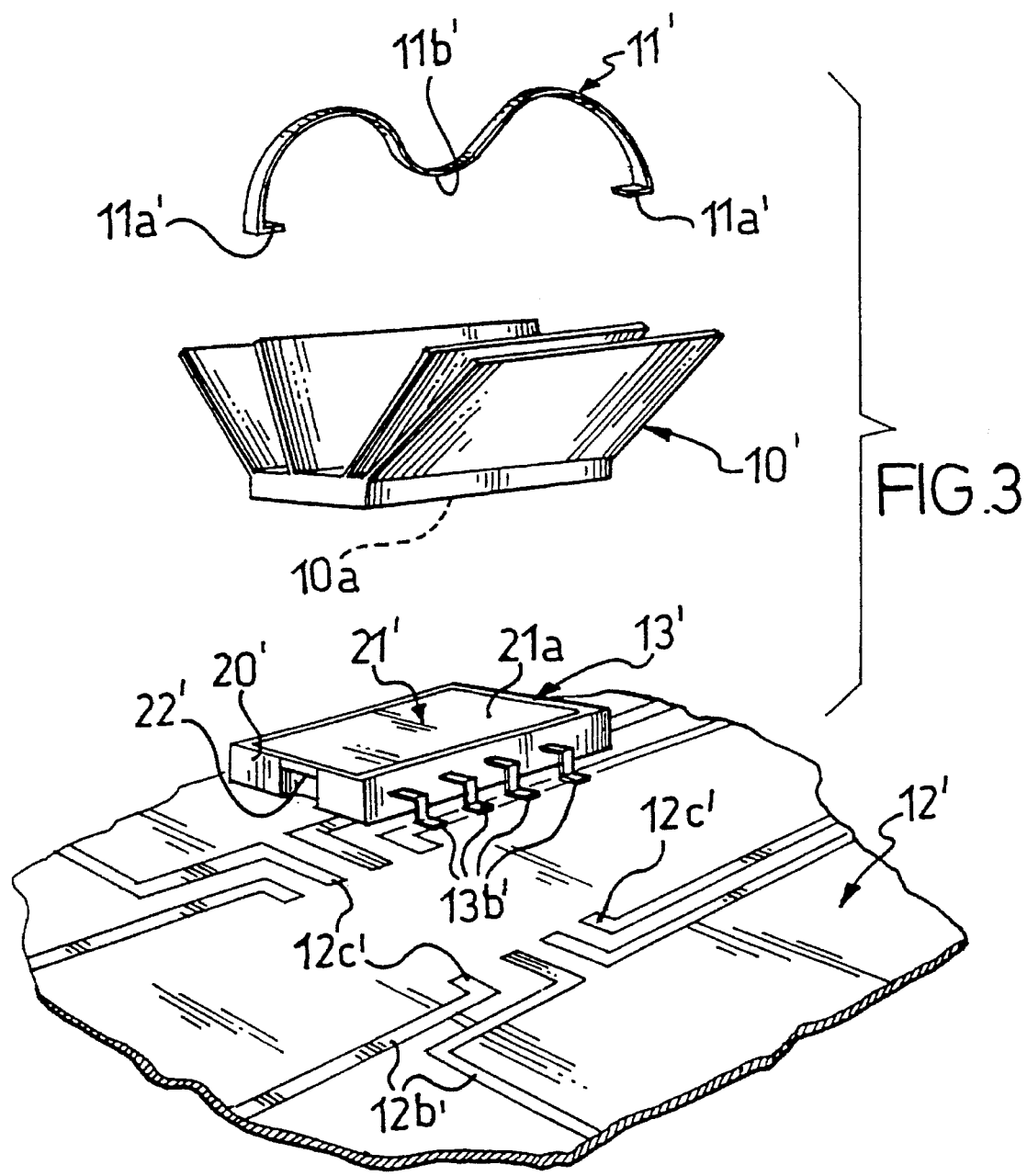
FIG. 3 shows in an exploded perspective view, drawn to an enlarged scale, a combination a according to this invention.

Prior art electronic semiconductor devices are shown in FIGS. 2 and 2A. The semiconductor device has a body 20 made of a plastics material which encapsulates a metal plate 21 having a major surface not visible in FIG. 2 but is similar to that shown as 21 a in. FIG. 3, and two edge areas 22 on an opposite side of the plate from the major surface. The body 20 encapsulating the metal plate leaves the major surface and the two edge areas 22 exposed. In the device of FIG. 2, two sets of electric contact terminals 23 jut out from opposite sides of the body 20 and are bent twice such that their end portions will lie in the same plane as the exposed major surface of the plate.

The device shown in FIG. 2 is mounted onto a printed circuit board, not shown, by soldering the exposed major surface of the plate 21 and the end portions of the contact terminals 23 at specially provided metallic areas of the board itself. A mold and a manufacturing method for a structure of this type are described in U.S. patent application Ser. No. 07/994,421, filed by this applicant on Dec. 21, 1992. The edge areas 22 unoccupied by the plastic body 20 are provided by specially designing the manufacturing mold to hold the metal plate 21 closely against the bottom of the mold cavity, thereby preventing the resin in a liquefied state from seeping in during its injection into the mold.

Figure 1:
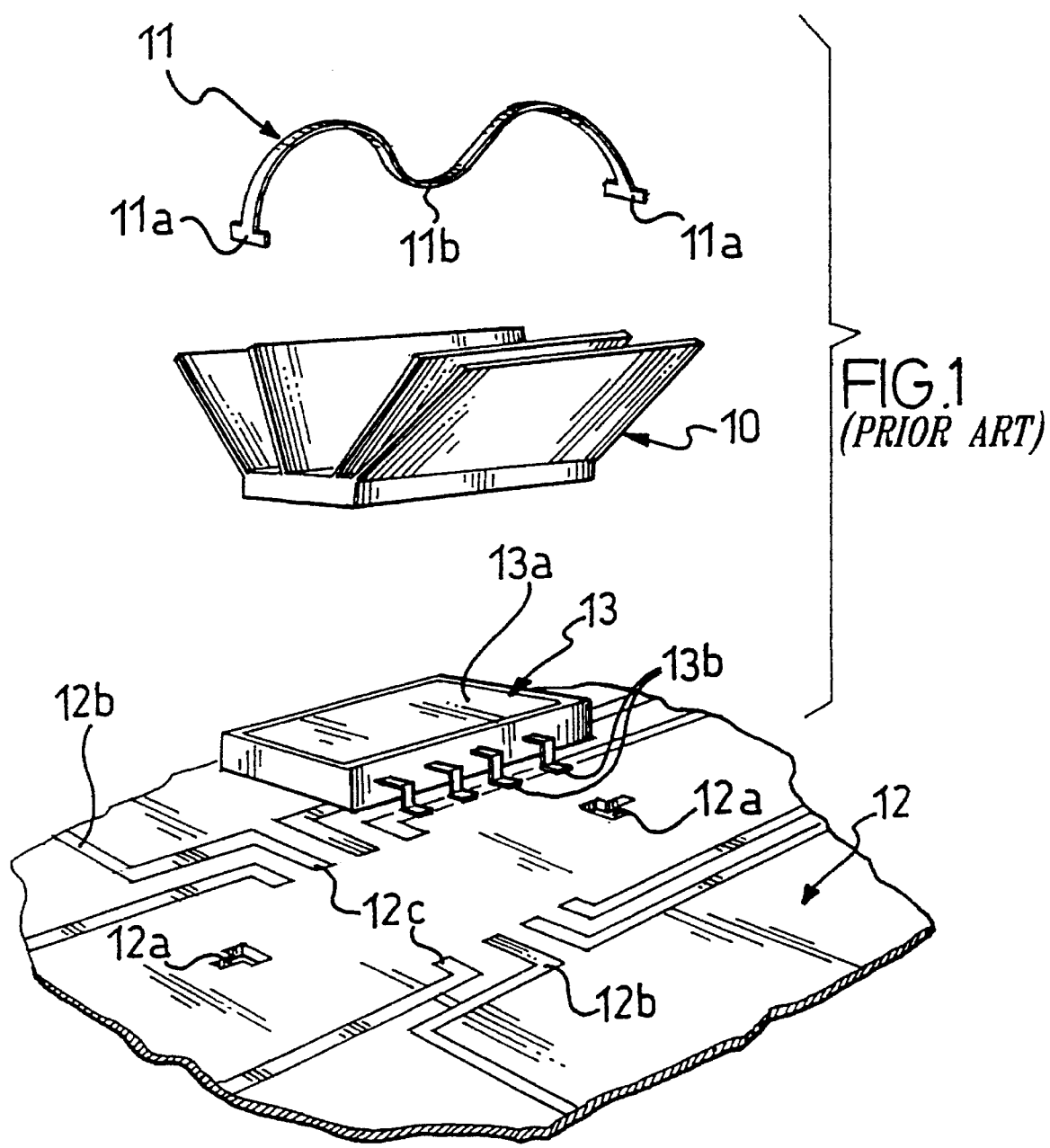
FIG. 1 is an exploded perspective view, drawn to an enlarged scale, of a conventional combination of an electronic device, heat sink, and attachment means as previously described.

Shown in FIG. 3, where similar or corresponding parts to those shown in FIGS. 1 and 2 are denoted by the same reference numbers with a prime added, is an electronic semiconductor device 13' which is adapted for installation on a printed circuit board 12' by having the end portions of its pins 13b' soldered to respective metallic areas 12c' of the printed circuit 12b' on the board 12'. As can be seen, this device differs from that shown in FIG. 2 in that the pins 13b' are first bent in the opposite direction from that of the device in FIG. 2, so that the exposed surface 21a of the metal plate 21' is located on the remote side from the mounting face of the device 13' to the board 12'. The two exposed edge areas 22' of the plate define here two undercut regions which are utilized, in accordance with the invention, to attach a heat sink 10'. This is accomplished, in the illustrated embodiment, using a clip 11', similar to that of the conventional combination shown in FIG. 1 but having its ends 11a' bent inwardly so as to engage the undercut regions 22' from the device 13'.

The various parts making up the inventive combination are assembled by first securing the electronic device 13' on the board 12', as by soldering its pins 13b' to the metallic areas 12c', arranging the heat sink 10' to bear with a flat surface 10a thereof on the exposed surface 21a of the device metal plate 21', and then applying the clip 11', as by deforming it elastically until it snaps with its end portions 11a' over the inner undercut regions 22' of the plate 21'. The heat sink can be disassembled by suitably deforming the clip 11' to release it from the undercut regions 21'.

Thus, a structure has been provided which can dissipate a large amount of heat and has the same requirements of printed circuit board area as a device with no external heat sink, and which imposes no particular strain on the solder spots of the device pins.

This invention does not involve for its implementation the provision of any specific electronic devices indeed, the devices can be made in the same molds as are employed for manufacturing devices intended for mounting with the metal plate in contact with the board surface. The electronic devices preferably have exposed areas of the plate on the remote side from the mounting face, and this can be accomplished using the same pin finishing and bending equipment.

Understandably, the invention may be also applied just as advantageously to devices other than the one illustrated, provided that they are formed, on opposite sides adjacent to the exposed surface of the plate, with grooves or recesses constituting undercut regions for the securement of the external heat sink fastening means.

We claim:

1. A combination of an electronic semiconductor device comprising a metal plate and a plastic body encapsulating the metal plate and leaving at least a major surface of the metal plate substantially exposed, a heat sink, and fastening means effective to hold a first surface of the heat sink in heat-conduction contact with the exposed major surface of the metal plate, wherein the semiconductor device has opposite sides with undercut regions, each of the undercut regions includes a recess in the insulating body, the recess being defined by a fastening surface facing away from the exposed major surface, and the fastening means releasably engage the fastening surfaces of the undercut regions.

2. The combination according to claim 1, wherein each of the fastening surfaces of the undercut regions comprises a surface of the metal plate opposite from the exposed major surface.

3. The combination according to claim 1, wherein the fastening means comprise a clip in the form of a shaped strip of spring steel having a middle portion adapted to contact the heat sink on a second surface which is opposite from the first surface of heat-conduction contact with the exposed surface of the metal plate and end adapted to engage the undercut regions, thereby pushing the heat sink against the exposed surface of the metal plate.

4. The combination according to claim 1, wherein the electronic semiconductor device has a plurality of electric contact terminals led out from opposite sides of the plastic body adjacent to the exposed surface of the metal plate, said terminals being soldered to a printed circuit board.

5. The combination according to claim 1, wherein the electronic semiconductor device includes a plurality of electric contact terminals extending from opposite sides of the plastic body and being bent away from the exposed major surface of the plate.

6. The combination according to claim 1, further including mounting means for coupling the semiconductor device to a printed circuit board without contacting the fastening clip with the printed circuit board.

7. An electronic semiconductor device comprising:

a heat conducting plate;

an insulating body encapsulating the plate and leaving a major surface of the plate substantially exposed;

a plurality of fastening regions integrally formed in the insulating body, each fastening region including a recess that exposes a portion of a surface of the plate opposite to the exposed major surface;

a heat sink contacting the plate; and a fastening clip contacting the heat sink and having ends engaging the plate at the exposed portions of the recesses, thereby coupling the plate and insulating body to the heat sink.

8. The electronic semiconductor device according to claim 7 wherein the fastening clip includes two ends that are angled inwardly toward a middle portion of the clip, the ends engaging the plate at the exposed portions.

9. The electronic semiconductor device according to claim 7 wherein the fastening clip includes a middle portion adapted to engage a central region of the heat sink on a surface that is opposite the heat sink surface that contacts the plate.

10. The electronic semiconductor device according to claim 9 wherein the fastening clip is generally M-shaped and the middle portion extends sufficiently toward a plane that includes ends of the fastening clip that the heat sink forces the middle portion away from the plane when the ends of the fastening clip engage the fastening regions, thereby creating a retentive force in the fastening clip that retains the heat sink in place on the plate.

11. The electronic semiconductor device according to claim 7, further comprising a plurality of electric contact terminals extending from a side of the insulating body and being angled away from the heat sink.

12. The electronic semiconductor device according to claim 7, further including mounting means for coupling the semiconductor device to a printed circuit board without contacting the fastening clip with the printed circuit board.

13. The electronic semiconductor device according to claim 12 wherein the mounting means includes a plurality of electric contact terminals extending from a side of the insulating body and a solder layer coupling the contact terminals to metallic areas of the printed circuit board.

14. The electronic semiconductor device according to claim 7, further including a plurality of electric contact terminals extending from opposite sides of the insulating body and being bent away from the exposed major surface of the plate for connection to a metallic area of a printed circuit board.

15. A method of coupling a heat sink to an electronic semiconductor device having an insulating body encapsulating a metal plate and leaving a major surface of the plate substantially exposed, the method comprising:

contacting the heat sink with the exposed major surface of the metal plate;

engaging the heat sink with a fastening clip; and engaging the fastening regions of the electronic semiconductor device with plural ends of the fastening clip by extending the ends of the fastening clip into recessed portions of the insulating body and engaging exposed portions of a surface of the metal plate opposite to the exposed major surface, thereby coupling the heat sink to the electronic semiconductor device.

16. The method according to claim 15, further comprising affixing the electronic semiconductor device to a printed circuit board without contacting the printed circuit board with the fastening clip.

17. The method according to claim 16 wherein the affixing step includes soldering contact terminals of the electronic semiconductor device to metallic areas of the printed circuit board.

* * * * *

UNITED STATES PATENT AND TRADEMARK OFFICE
CERTIFICATE OF CORRECTION

PATENT NO. : 5,521,439
DATED : May 28, 1996
INVENTOR(S) : Paolo Casati et al

It is certified that error appears in the above-indentified patent and that said Letters Patent is hereby corrected as shown below:

On the title page, item[73] Assignee: SGS-Thomson Microelectronics S.r.l. Agrate Brianza (MI), Italy Column 4, claim 3, line 6, delete the word "end" and replace it --ends--.

Signed and Sealed this

Eleventh Day of February, 1997

Attest:

BRUCE LEHMAN

*Attesting Officer*  *Commissioner of Patents and Trademarks*